(12) United States Patent
Son (10) Patent No.: US 7,764,114 B2
(45) Date of Patent: Jul. 27, 2010

(54) VOLTAGE DIVIDER AND INTERNAL SUPPLY VOLTAGE GENERATION CIRCUIT INCLUDING THE SAME

(75) Inventor: Jong-Pil Son, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 12/218,381

(22) Filed: Jul. 15, 2008

(65) Prior Publication Data

US 2009/0027105 A1    Jan. 29, 2009

(30) Foreign Application Priority Data

Jul. 23, 2007    (KR) .................. 10-2007-0073484

(51) Int. Cl.
*G05F 1/575*    (2006.01)

(52) U.S. Cl. .................. 327/541; 327/543; 327/513; 323/313

(58) Field of Classification Search .................. None
See application file for complete search history.

(56) References Cited

U.S. PATENT DOCUMENTS

| | | | | |
|---|---|---|---|---|
| 5,146,152 | A * | 9/1992 | Jin et al. .................. | 323/280 |
| 5,654,645 | A * | 8/1997 | Lotfi .................. | 326/24 |
| 6,486,646 | B2 | 11/2002 | Kang | |
| 6,791,308 | B2 * | 9/2004 | Shim .................. | 323/314 |
| 6,937,001 | B2 * | 8/2005 | Ueda .................. | 323/313 |
| 7,116,158 | B2 * | 10/2006 | Teel et al. .................. | 327/539 |
| 7,489,578 | B2 * | 2/2009 | Park .................. | 365/211 |
| 7,518,437 | B2 * | 4/2009 | Yamasaki .................. | 327/543 |
| 2002/0070722 | A1 | 6/2002 | Kang | |
| 2005/0093581 | A1 | 5/2005 | Kang | |
| 2006/0232326 | A1 | 10/2006 | Seitz et al. | |

FOREIGN PATENT DOCUMENTS

| | | |
|---|---|---|
| KR | 10-2002-0041876 A | 6/2002 |
| KR | 10-2005-0041592 A | 5/2005 |

* cited by examiner

*Primary Examiner*—Lincoln Donovan
*Assistant Examiner*—Terry L Englund
(74) *Attorney, Agent, or Firm*—Mills & Onello, LLP (57) ABSTRACT

In a voltage divider and an internal supply voltage generation circuit, the voltage divider includes a first transistor having a resistance value that varies in proportion to a change in temperature; and a second transistor having a resistance value that varies in inverse proportion to the change in temperature.

10 Claims, 6 Drawing Sheets

|  | TEMPERATURE INCREASE | TEMPERATURE DECREASE |
|---|---|---|
| R1 | INCREASE | DECREASE |
| R2 | DECREASE | INCREASE |

< M1 : REGION1, M2 : REGION2 >

FIG. 3C

|  | TEMPERATURE INCREASE | TEMPERATURE DECREASE |
|---|---|---|
| R1 | DECREASE | INCREASE |
| R2 | INCREASE | DECREASE |

< M1 : REGION2, M2 : REGION1 >

VOLTAGE DIVIDER AND INTERNAL SUPPLY VOLTAGE GENERATION CIRCUIT INCLUDING THE SAME

This application claims priority to Korean Patent Application No. 10-2007-0073484 filed on Jul. 23, 2007 in the Korean Intellectual Property Office, the disclosure of which is incorporated herein by reference in its entirety.

BACKGROUND OF THE INVENTION

1. Field of the Invention

Embodiments of the present invention relate to a voltage divider and an internal supply voltage generation circuit including the same.

2. Description of the Related Art

Semiconductor memory devices commonly include an internal supply voltage generation circuit in order to operate at a low voltage and consume low power. The internal supply voltage generation circuit receives an external supply voltage and generates an internal supply voltage which is lower than the external supply voltage. For example, the internal supply voltage generation circuit can receive an external supply voltage of 3.3 V and can generate an internal supply voltage of approximately 2.8 V.

In the semiconductor memory device, in certain applications, the voltage level of the internal supply voltage is to be maintained at a constant level, irrespective of a change in temperature. For example, the level of the internal supply voltage applied to a memory cell array needs to be maintained at a constant level. Alternatively, in certain applications, the level of the internal supply voltage can be made to be increased in response to the change in temperature. For example, the level of the internal supply voltage applied to peripheral circuits needs to be raised in order to increase device operating speed. Alternatively, in certain applications, the level of the internal supply voltage can be made to be lowered in response to the change in temperature. It is therefore desired to manage temperature dependence of the level of the internal supply voltage.

SUMMARY OF THE INVENTION

Embodiments of the present invention provide a voltage divider which can control temperature dependence of a supply voltage.

The present invention also provides an internal supply voltage generation circuit which can control temperature dependence of a supply voltage.

According to an aspect of the present invention, there is provided a voltage divider including a first transistor having a resistance value that varies in proportion to a change in temperature; and a second transistor having a resistance value that varies in inverse proportion to the change in temperature.

A first bias voltage can be applied to the first transistor so that the first transistor can operate in a first temperature-dependent region, and a second bias voltage can be applied to the second transistor so that the second transistor can operate in a second temperature-dependent region, wherein the first temperature-dependent region is a region in which drain-source current is reduced as temperature increases, and the second temperature-dependent region is a region in which the drain-source current is increased as the temperature increases.

The first bias voltage can be applied from an external source to a gate of the first transistor, and the second bias voltage can be applied from the external source to a gate of the second transistor.

The first transistor and the second transistor can be p-channel metal oxide semiconductor (PMOS) transistors, and first transistor and the second transistor can be n-channel metal oxide semiconductor (NMOS) transistors.

In one embodiment, at least one of the first transistor and the second transistor is not diode-connected.

According to another aspect of the present invention, there is provided a voltage divider including a first transistor having a gate to which a first bias voltage is applied and operating in a first temperature-dependent region; and a second transistor connected to the first transistor in series, having a gate to which a second bias voltage is applied, and operating in a second temperature-dependent region, wherein the first temperature-dependent region is a region in which drain-source current is reduced as temperature increases, and the second temperature-dependent region is a region in which the drain-source current is increased as the temperature increases.

In one embodiment, when the temperature increases, a resistance value of the first transistor is increased while a resistance value of the second transistor is reduced.

In one embodiment, the first transistor and the second transistor are PMOS transistors.

In one embodiment, at least one of the first transistor and the second transistor is not diode-connected.

According to another aspect of the present invention, there is provided an internal supply voltage generation circuit including an output unit receiving an internal reference voltage and a feedback voltage and outputting an internal supply voltage; and a voltage divider including a first transistor and a second transistor connected in series, dividing the internal supply voltage, generating the feedback voltage, and feeding the feedback voltage back to the output unit, wherein the first transistor has a resistance value that varies in proportion to a change in temperature, and the second transistor having a resistance value that varies in inverse proportion to the change in temperature.

A first bias voltage can be applied to the first transistor so that the first transistor can operate in a first temperature-dependent region, and a second bias voltage can be applied to the second transistor so that the second transistor can operate in a second temperature-dependent region, wherein the first temperature-dependent region is a region in which drain-source current is reduced as temperature increases, and the second temperature-dependent region is a region in which the drain-source current is increased as the temperature increases.

The first bias voltage can be applied from an external source to a gate of the first transistor, and the second bias voltage can be applied from the external source to a gate of the second transistor.

In one embodiment, the first transistor and the second transistor are PMOS transistors.

In one embodiment, the first transistor and the second transistor are NMOS transistors.

In one embodiment, at least one of the first transistor and the second transistor is not diode-connected.

In one embodiment, when the internal supply voltage is applied to an output node and the feedback voltage is applied to a feedback node, the first transistor is connected between the output node and the feedback node, and the second transistor is connected between the feedback node and a ground node.

In one embodiment, when the internal supply voltage is applied to an output node and the feedback voltage is applied to a feedback node, the second transistor is connected between the output node and the feedback node, and the first transistor is connected between the feedback node and the ground node.

In one embodiment, the output unit comprises: a comparator that compares the internal reference voltage to the feedback voltage and outputting a comparison voltage according to the comparison result; and a driver that outputs the internal supply voltage in response to a level of the comparison voltage.

BRIEF DESCRIPTION OF THE DRAWINGS

The above and other features and advantages of the embodiments of the present invention will become more apparent by describing in detail preferred embodiments thereof with reference to the attached drawings in which.

DETAILED DESCRIPTION OF EMBODIMENTS

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Like reference numerals in the drawings denote like elements, and thus their description will be omitted.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "drain-source current", as used in the claims, may be interpreted as "source-drain current" in accordance with the type of transistor.

Figure 1A:
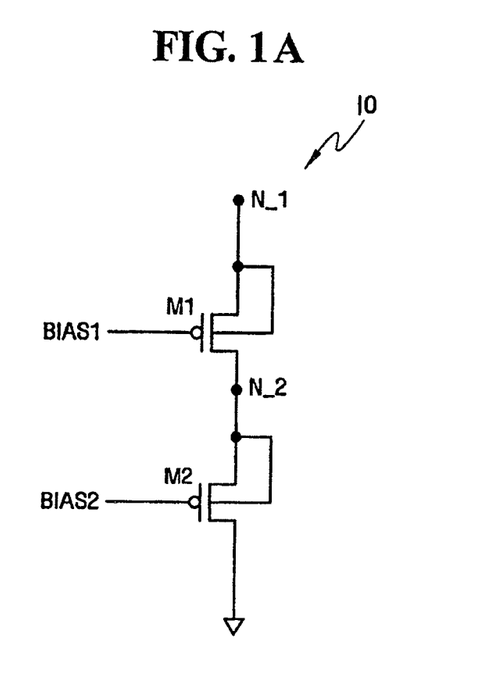
FIGS. 1A and 1B are circuit diagrams of a voltage divider according to exemplary embodiment of the present invention
Figure 1B:
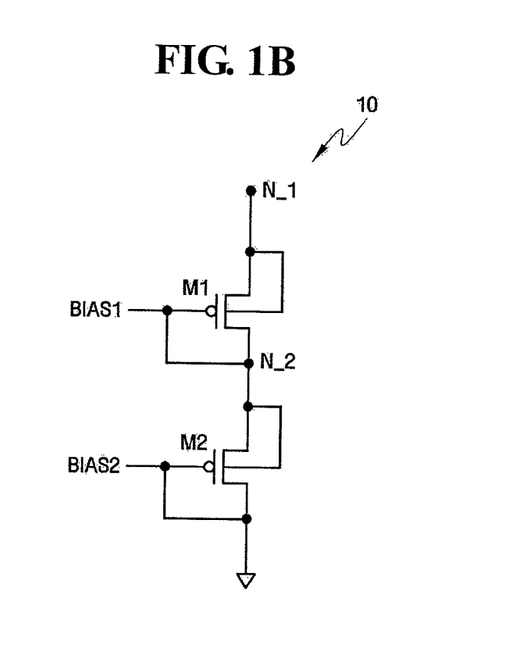
Figure 2A:
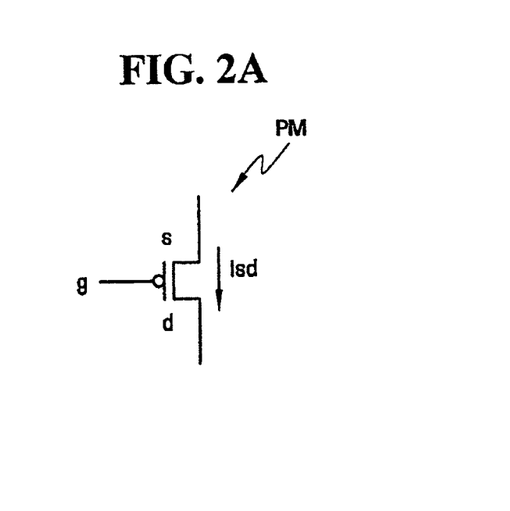
FIG. 2A is a circuit diagram of a p-channel metal oxide semiconductor (PMOS) transistor.
Figure 2B:
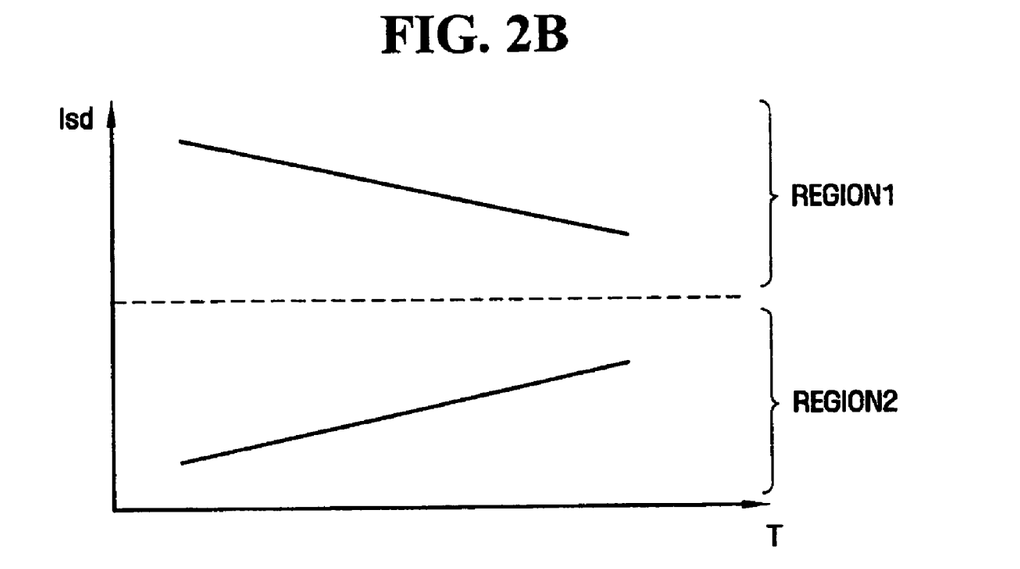
FIG. 2B is a graph illustrating source-drain current of the PMOS transistor of FIG. 2A with respect to temperature.
Figure 3A:
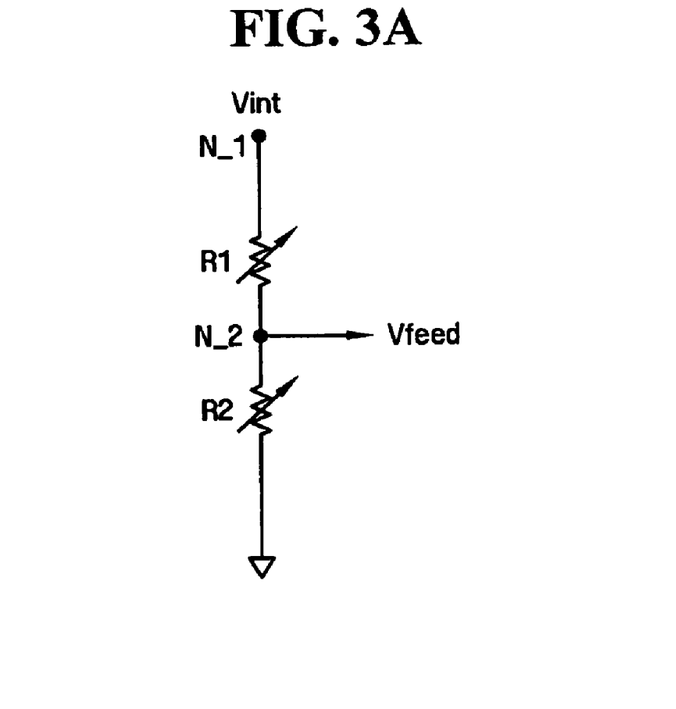
FIG. 3A is an equivalent circuit diagram of the voltage divider of FIG. 1.
Figure 3B:
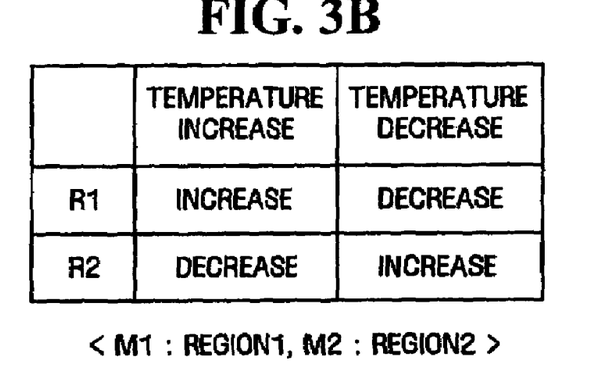
FIGS. 3B and 3C are tables summarizing the variation in resistance value of each the resistors of FIG. 3A with respect to temperature.
Figure 3C:
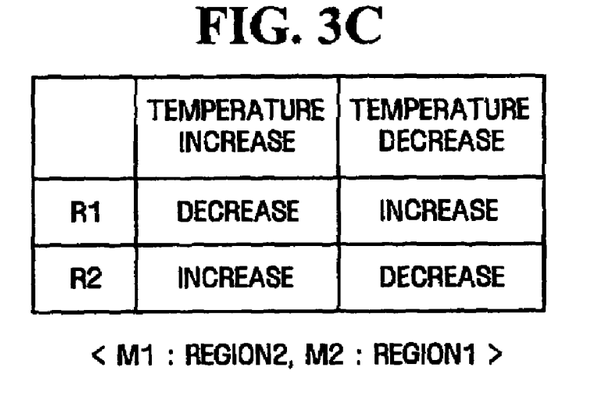
Figure 4:
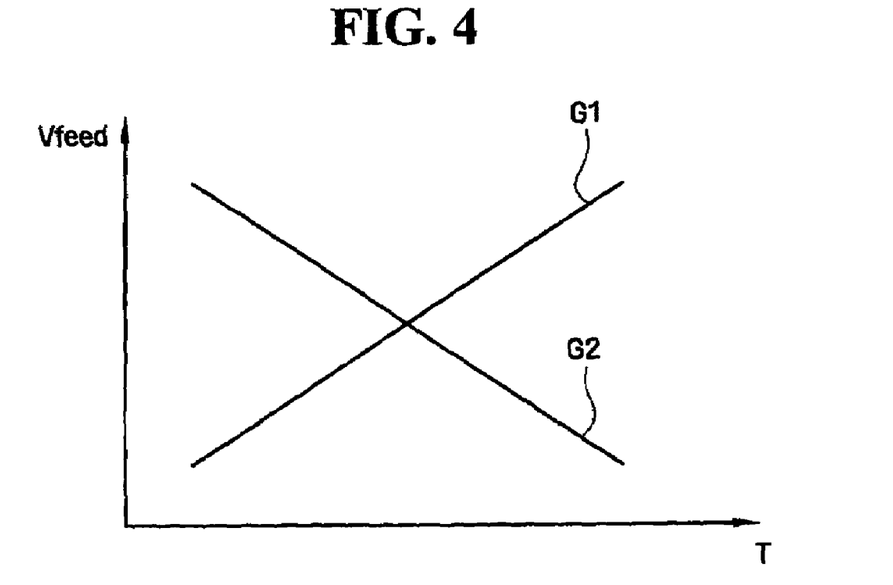
FIG. 4 is a graph for explaining the operation of the voltage divider of FIG. 1.

Hereinafter, a voltage divider according to an exemplary embodiment of the present invention will be described with reference to FIGS. 1A through 4. FIGS. 1A and 1B are circuit diagram of a voltage divider 10 according to exemplary embodiments of the present invention. FIG. 2A is a circuit diagram of a p-channel metal oxide semiconductor (PMOS) transistor PM, and FIG. 2B is a graph illustrating source-drain current of the PMOS transistor PM with respect to temperature. FIG. 3A is an equivalent circuit diagram of the voltage divider 10 of FIG. 1, and FIGS. 3B and 3C are tables summarizing the variation in resistance value of each of the resistors R1, R2 of FIG. 3A with respect to temperature. FIG. 4 is a graph for explaining the operation of the voltage divider 10 of FIGS. 1B.

Referring to FIGS. 1A and 1B, the voltage divider 10 includes a first transistor M1 and a second transistor M2 connected in series. The first transistor M1 may be connected between a first node N_1 and a second node N_2, and the second transistor M2 may be connected between the second node N_2 and a ground voltage level. A first bias voltage BIAS1 is applied to the gate of the first transistor M1 so that it can operate in a first temperature-dependent region REGION1. A second bias voltage BIAS2 is applied to the gate of the second transistor M2 so that it can operate in a second temperature-dependent region REGION2. The first temperature-dependent region REGION1 refers to a region of operation of the transistor in which the source-drain current Isd is reduced as temperature increases. Also, the second temperature-dependent region REGION2 refers to a region of operation of the transistor in which the source-drain current Isd is increased as temperature increases.

In various embodiments, the first bias voltage BIAS1 and the second bias voltage BIAS2 can be supplied from an external source. The first transistor M1 and the second transistor M2 may be PMOS transistors. The first transistor M1 may also be provided with the first bias voltage BIAS1 and operate in the second temperature-dependent region REGION2, and the second transistor M2 may also be provided with the second bias voltage BIAS2 and operate in the first temperature-dependent region REGION1. Although in the embodiment of FIG. 1B, the first and second transistors are illustrated as being diode-connected, in other embodiments, at least one of the first transistor M1 and the second transistor M2 is not diode-connected (see for example FIG. 1A). In addition, another device, such as a resistor or a diode, may further be connected between the first transistor M1 and the second transistor M2.

Specifically, referring to FIGS. 2A and 2B, the graph of FIG. 2B is divided into two regions, that is, the first temperature-dependent region REGION1 and the second temperature-dependent region REGION2. In the first temperature-dependent region REGION1, the source-drain current Isd of the PMOS transistor PM is reduced as temperature T increases and is increased as the temperature T decreases. In the second temperature-dependent region REGION2, the source-drain current Isd is increased as the temperature T increases and is reduced as the temperature T decreases.

Whether the PMOS transistor PM operates in the first temperature-dependent region REGION1 or the second temperature-dependent region REGION2 is determined by a voltage between a source s and a gate g of the PMOS transistor PM, which will now be described in more detail using equations below. For convenience of description, a saturation region will be used as an example. However, embodiments of the present invention are not limited thereto.

$$Isd = \frac{\mu_P C_{OX}}{2m} \frac{W}{L}(Vsg - |Vtp|)^2. \quad (1)$$

Equation (1) represents the source-drain current Isd of the PMOS transistor PM in a saturation region. In Equation (1), $\mu_p$ indicates mobility of a carrier, $C_{ox}$ indicates gate capacitance, m indicates a body effect, Vsg indicates a voltage between the source s and the gate g of the PMOS transistor PM, and Vtp indicates a threshold voltage of the PMOS transistor PM.

When Equation (1) is differentiated with respect to the temperature T, the following equation is obtained.

$$\frac{\partial Isd}{\partial T} = (Vsg - |Vtp|)\left\{\left(\frac{1}{\mu_P}\frac{\partial \mu_P}{\partial T} - \frac{1}{m}\frac{\partial m}{\partial T}\right)(Vsg - |Vtp|) - \frac{2\partial|Vtp|}{\partial T}\right\}. \quad (2)$$

Equation (2) determines a sign representing the variation in the source-drain current Isd with respect to the temperature T as shown in Table 1.

dition may be determined by the voltage between the source s and the gate g of the PMOS transistor PM.

In the case of the first transistor M1 and the second transistor M2 illustrated in FIGS. 1A and 1B, the first bias voltage BIAS1 and the second bias voltage BIAS2 applied to respective gates of the first transistor M1 and the second transistor M2 may determine whether a transistor is operating in the first or the second condition. For example, the first bias voltage BIAS1 may be applied to the first transistor M1 so that a voltage between a source and a gate of the first transistor M1 determines the second condition. In this case, the first transistor M1 operates in the first temperature-dependent region REGION1. In addition, the second bias voltage BIAS2 may be applied to the second transistor M2 so that a voltage between a source and a gate of the second transistor M2 determines the first condition. In this case, the second transistor M2 operates in the second temperature-dependent region REGION2.

The voltage divider 10 described above may be represented by an equivalent circuit of FIG. 3A. Referring to FIG. 3A, the first transistor M1 may be connected between the first node N_1 and the second node N_2, and the second transistor M2 may be connected between the second node N_2 and the ground. The first transistor M1 and the second transistor M2 may be represented by first and second variable resistors R1 and R2, respectively. That is, the first transistor M1 may be represented by the first resistor R1, and the second transistor M2 may be represented by the second resistor R2. The first resistor R1 may have a value that varies in proportion to a change in temperature, and the second resistor R2 may have a value that varies in inverse proportion to a change in temperature. The voltage divider 10 divides an internal supply voltage Vint and outputs a feedback voltage Vfeed. Here, a level of the feedback voltage Vfeed may vary according to the value of each of the first and second variable resistors R1 and R2.

The value of each of the first and second resistors R1 and R2 according to a change in the temperature T when the first transistor M1 operates in the first temperature-dependent region REGION1 and the second transistor M2 operates in the second temperature-dependent region REGION2 will be described in more detail with reference to FIGS. 2B, 3A and 3B, and Table 1. When the temperature T increases, the source-drain current Isd of the first transistor M1 is reduced. Accordingly, the value of the first resistor R1 is increased

TABLE 1

| Condition | | Sign | Temperature-dependent Region |
|---|---|---|---|
| First condition | $0 < (Vsg - |Vtp|) < \frac{2\partial|Vtp|}{\partial T} \Big/ \left(\frac{1}{\mu_P}\frac{\partial \mu_P}{\partial T} - \frac{1}{m}\frac{\partial m}{\partial T}\right)$ | Positive | Second temperature-dependent region |
| Second condition | $(Vsg - |Vtp|) > \frac{2\partial|Vtp|}{\partial T} \Big/ \left(\frac{1}{\mu_P}\frac{\partial \mu_P}{\partial T} - \frac{1}{m}\frac{\partial m}{\partial T}\right)$ | Negative | First temperature-dependent region |

Referring to Table 1, in a first condition, the sign representing the variation in the source-drain current Isd with respect to the temperature T becomes positive. That is, if the temperature T increases, the source-drain current Isd is increased. In a second condition, the sign representing the variation in the source-drain current Isd with respect to the temperature T becomes negative. That is, if the temperature T increases, the source-drain current Isd is reduced. The first or second conwhen the temperature T increases as illustrated in FIG. 3B. That is, the first resistor R1 has a value that varies in proportion to a change in the temperature T. When the temperature T increases, the source-drain current Isd of the second transistor M2 is increased. Accordingly, under these conditions, the value of the second resistor R2 is reduced when the temperature T increases as illustrated in FIG. 3B. That is, the second resistor R2 has a value that varies in inverse proportion to a change in the temperature T.

Next, the value of each of the first and second resistors R1 and R2 according to a change in the temperature T when the first transistor M1 operates in the second temperature-dependent region REGION2 and the second transistor M2 operates in the first temperature-dependent region REGION1 will be described in more detail with reference to FIGS. 2B, 3A and 3C, and Table 1. When the temperature T increases, the source-drain current Isd of the first transistor M1 is increased. Accordingly, the value of the first resistor R1 is reduced when the temperature T increases as illustrated in FIG. 3C. That is, the first resistor R1 has a value that varies in inverse proportion to a change in the temperature T. When the temperature T increases, the source-drain current Isd of the second transistor M2 is reduced. Accordingly, under these conditions, the value of the second resistor R2 is increased when the temperature T increases as illustrated in. FIG. 3C. That is, the second resistor R2 has a resistance value that varies in proportion to a change in the temperature T.

The operation of the voltage divider 10 will now be described in detail with reference to FIGS. 3A through 3C and 4.

The voltage divider 10 divides the internal supply voltage Vint and outputs the feedback voltage Vfeed. The feedback voltage Vfeed may be defined by $$Vfeed = Vint \times \{R2/(R1+R2)\} \qquad (3).$$

When the first transistor M1 operates in the first temperature-dependent region REGION1 and the second transistor M2 operates in the second temperature-dependent region REGION2, if the temperature T increases, the resistance value of the first transistor M1 is increased while that of the second transistor M2 is reduced. Therefore, the feedback voltage Vfeed is reduced according to Equation (3). That is, the feedback voltage Vfeed may be represented by a first curve G1 of FIG. 4.

When the first transistor M1 operates in the second temperature-dependent region REGION 2 and the second transistor M2 operates in the first temperature-dependent region REGION1, if the temperature T increases, a resistance value of the first transistor M1 is reduced while that of the second transistor M2 is increased. Therefore, the feedback voltage Vfeed is increased according to Equation (3). That is, the feedback voltage Vfeed may be represented by a second curve G2 of FIG. 4.

As described above, the voltage divider 10 can control temperature dependence according to the first bias voltage BIAS I and the second bias voltage BIAS2.

Figure 5:
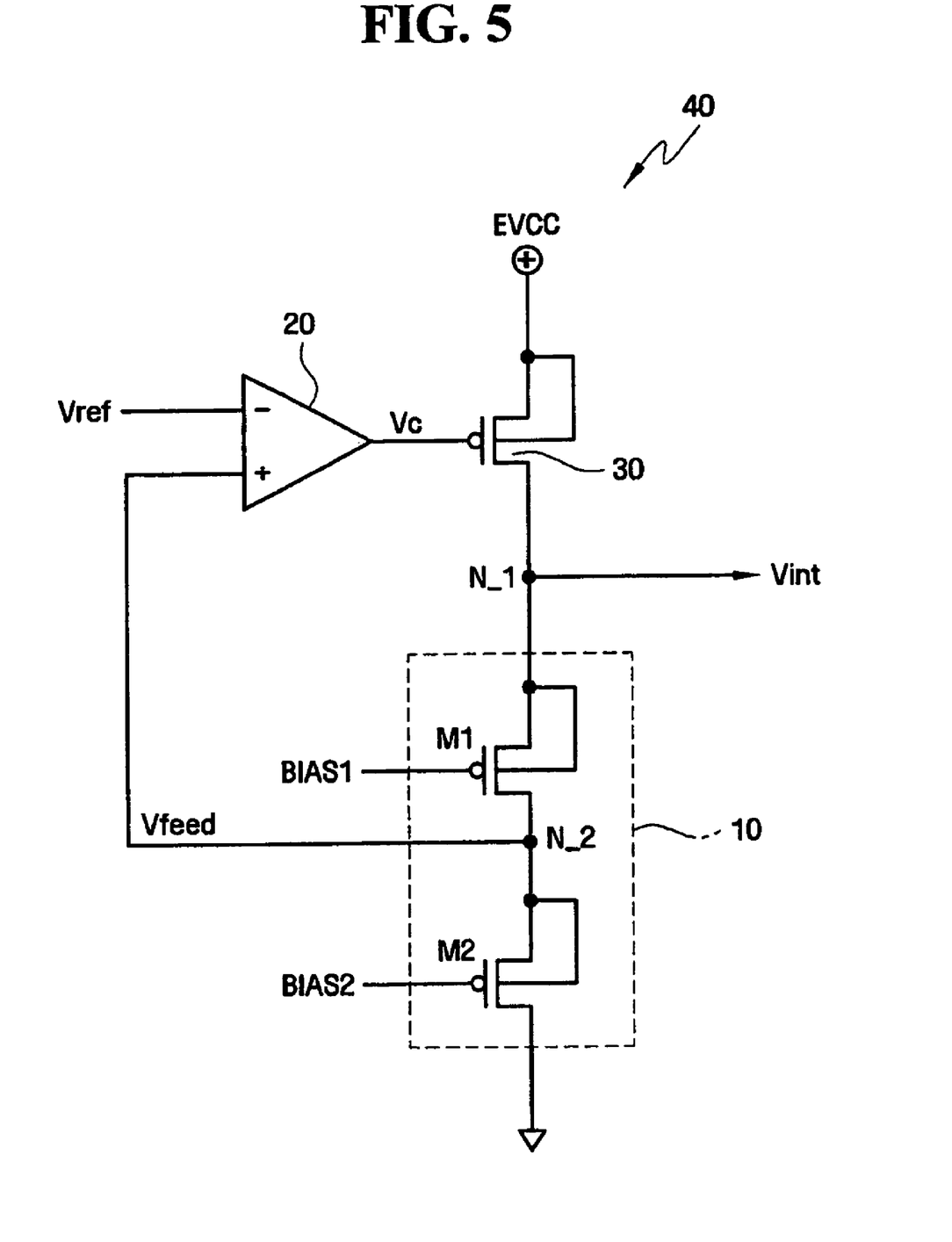
FIG. 5 is a circuit diagram of an internal supply voltage generation circuit according to an exemplary embodiment of the present invention.
Figure 6:
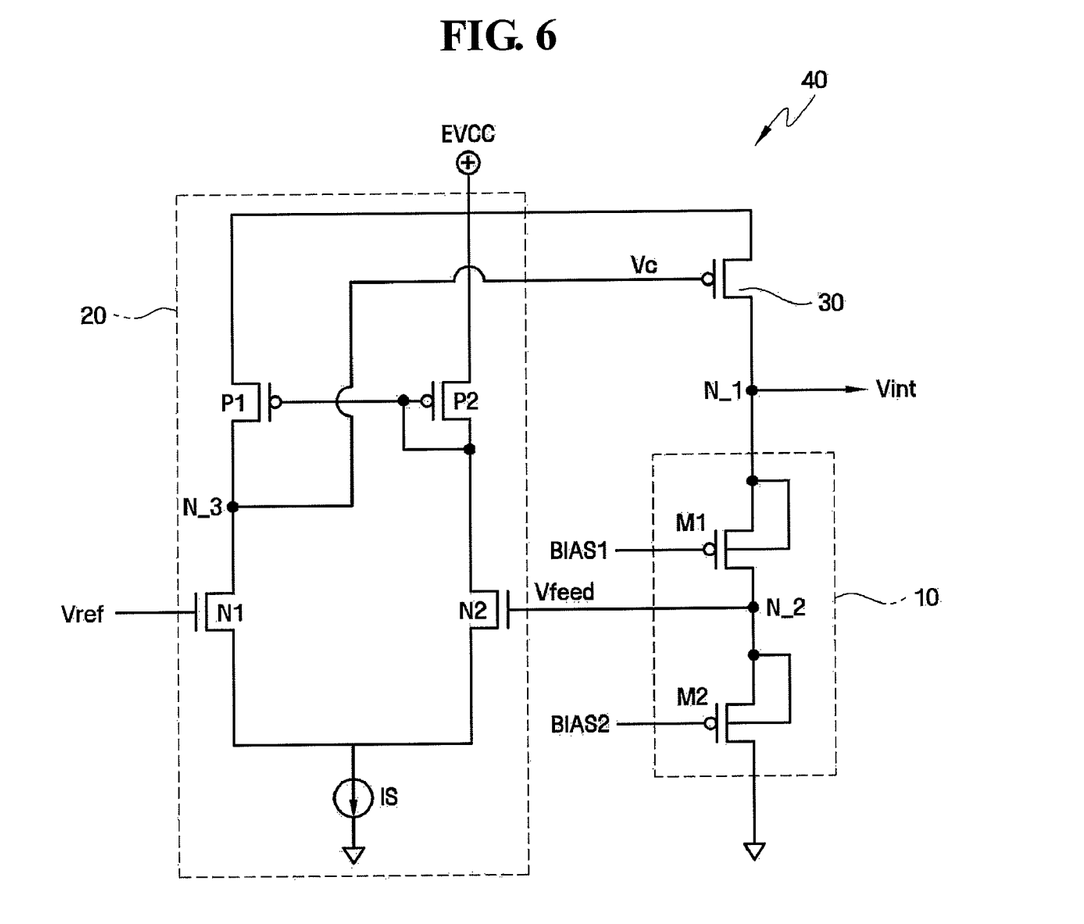
FIG. 6 is an exemplary circuit diagram for explaining the operation of the internal supply voltage generation circuit of FIG. 5.

An internal supply voltage generation circuit according to an exemplary embodiment of the present invention will now be described with reference to FIGS. 5 and 6. FIG. 5 is a circuit diagram of an internal supply voltage generation circuit 40 according to an exemplary embodiment of the present invention. FIG. 6 is an exemplary circuit diagram for explaining the operation of the internal supply voltage generation circuit 40 of FIG. 5. Elements having the same functions as those illustrated in FIGS. 1A and 1B are indicated by like reference numerals, and thus their detailed description will be omitted.

Referring to FIG. 5, the internal supply voltage generation circuit 40 includes an output unit and a voltage divider 10. The output unit receives an internal reference voltage Vref and a feedback voltage Vfeed and outputs an internal supply voltage Vint. The voltage divider 10 divides the internal supply voltage Vint, generates the feedback voltage Vfeed, and feeds the feedback voltage Vfeed back to the output unit. The output unit includes a comparator 20 and a driver 30.

The operation of the internal supply voltage generation circuit 40 will now be described in more detail with reference to FIGS. 5 and 6.

The output unit includes the comparator 20, which compares the internal reference voltage Vref to the feedback voltage Vfeed and outputs a comparison voltage Vc based on the comparison result, and the driver 30 which outputs the internal supply voltage Vint in response to a level of the comparison voltage Vc.

The comparator 20 may include two PMOS transistors P1 and P2, two n-channel metal oxide semiconductor (NMOS) transistors N1 and N2, and a constant current source Is. An external supply voltage EVCC is connected to respective sources of the PMOS transistors P1 and P2, and respective gates of the PMOS transistors P1 and P2 are connected to each other. In addition, respective drains of the NMOS transistors N1 and N2 are respectively connected to respective drains of the PMOS transistors P1 and P2. Respective sources of the NMOS transistors N1 and N2 are connected to the constant current source Is. The internal reference voltage Vref is applied to the gate of the NMOS transistor N1, and the feedback voltage Vfeed is applied to the gate of the NMOS transistor N2.

The driver 30 may include a PMOS transistor. The external supply voltage EVCC is applied to a source of the PMOS transistor of the driver 30, and a gate of the PMOS transistor of the driver 30 is connected to the drain of the PMOS transistor P1. A drain of the PMOS transistor of the driver 30 is connected to the voltage divider 10 and outputs the internal supply voltage Vint.

The voltage divider 10 includes first and second PMOS transistors M1 and M2. In one embodiment, the first transistor M1 may operate in the second temperature-dependent region REGION2, and the second transistor M2 may operate in the first temperature-dependent region REGION1. That is, when temperature increases, a resistance value of the first transistor M1 is reduced while the resistance value of the second transistor M2 and the feedback voltage Vfeed are increased. Therefore, the internal supply voltage generation circuit 40 may output the internal supply voltage Vint at a constant level, even if the internal reference voltage Vref is increased as the temperature increases. Alternatively, the internal supply voltage generation circuit 40 may output the internal supply voltage Vint at a level that is reduced as the temperature increases. In alternative embodiments, at least one of the first transistor M1 and the second transistor M2 is not diode-connected. In addition, another device, such as a resistor or a diode, may further be connected between the first transistor M1 and the second transistor M2.

More specifically, the comparator 20 is a differential amplifier and determines a voltage level of a node N_3 by comparing the internal reference voltage Vref to the feedback voltage Vfeed output from the voltage divider 10. When temperature increases, so do the internal reference voltage Vref and the feedback voltage Vfeed. For example, if the feedback voltage Vfeed is higher than the internal reference voltage Vref, the comparator 20 increases the voltage level of the node N_3. That is, the level of the comparison voltage Vc is increased. The comparison voltage Vc is applied to the gate of the PMOS transistor of the driver 30, which, in turn, lowers the level of the internal supply voltage Vint. That is, the internal supply voltage generation circuit 40 prevents the internal supply voltage Vint from increasing even when the internal reference voltage Vref is increased as the temperature increases. That is, the level of the internal supply voltage Vint may be maintained at a constant level, or may be lowered, as the temperature increases. In this case, the internal supply voltage generation circuit 40 may be a circuit providing the internal supply voltage Vint to a memory cell array. That is, the internal supply voltage generation circuit 40 may provide the internal supply voltage Vint to the memory cell array in a stable manner.

Alternatively, the first transistor M1 of the voltage divider 10 may operate in the first temperature-dependent region REGION1, and the second transistor M2 may operate in the second temperature-dependent region REGION2. That is, when the temperature increases, the resistance value of the first transistor M1 is increased while the resistance value of the second transistor M2 and the feedback voltage Vfeed are reduced. If the internal reference voltage Vref is increased as the temperature increases, the internal supply voltage generation circuit 40 increases the level of the internal supply voltage Vint.

More specifically, when the temperature increases, the internal reference voltage Vref is increased while the feedback voltage Vfeed is reduced. For example, if the feedback voltage Vfeed is lower than the internal reference voltage Vref, the comparator 20 lowers the voltage level of the node N_3. That is, the level of the comparison voltage Vc is lowered. The comparison voltage Vc is applied to the gate of the PMOS transistor of the driver 30, which, in turn, raises the level of the internal supply voltage Vint. Since the level of the comparison voltage Vc applied to the gate of the PMOS transistor is lowered, the driver 30 raises the level of the internal supply voltage Vint. That is, when the temperature increases, the internal supply voltage generation circuit 40 increases the level of the internal supply voltage Vint. In this case, the internal supply voltage generation circuit 40 may be a circuit providing the internal supply voltage Vint to peripheral circuits of a semiconductor memory device. That is, when the temperature increases, the internal supply voltage generation circuit 40 may provide a high internal supply voltage Vint to the peripheral circuits and thus increase operating speed. An internal circuit of the comparator 20 included in the internal supply voltage generation circuit 40 is not limited to the one illustrated in FIG. 6, which is provided merely as an example of such a circuit 40.

Figure 7:
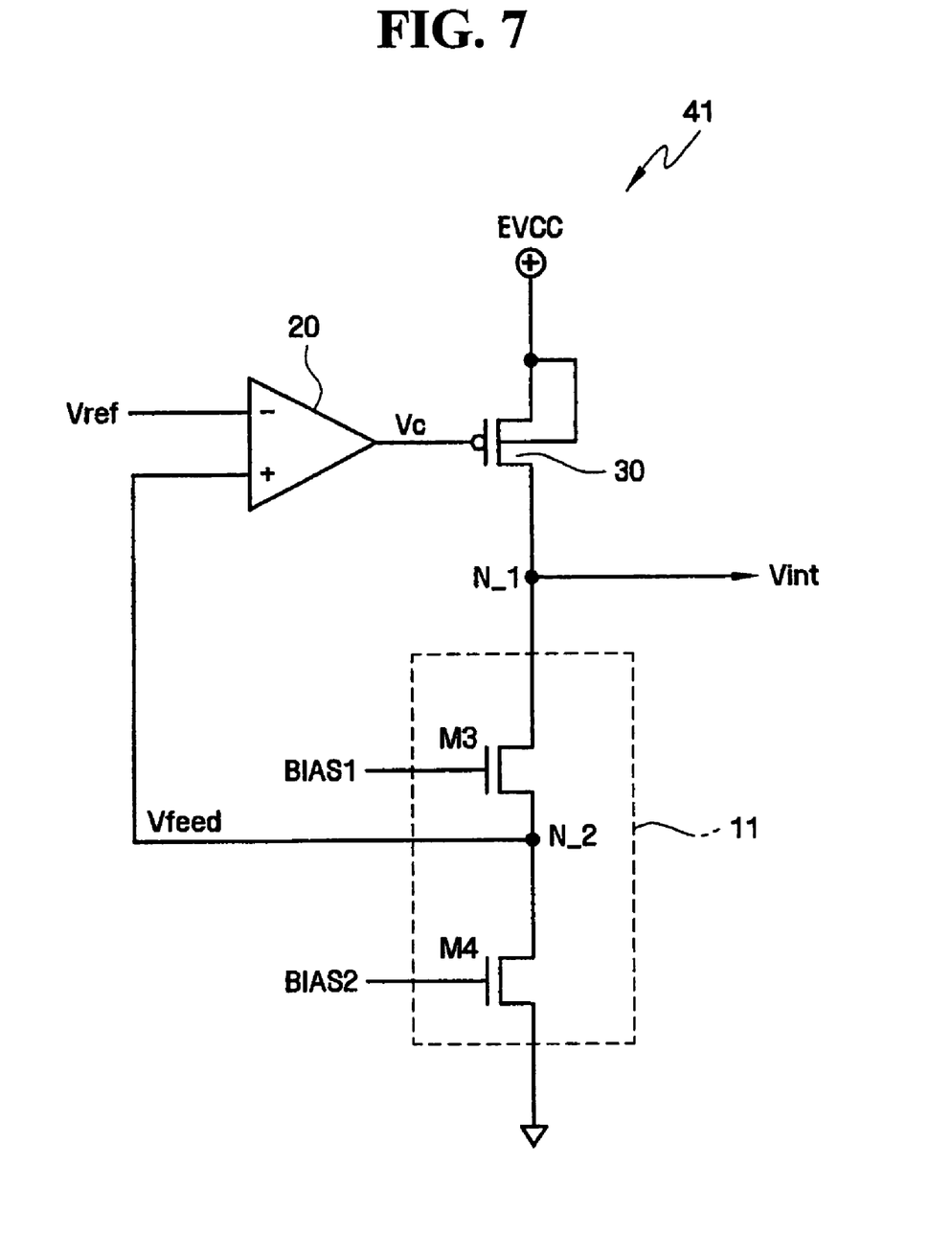
FIG. 7 is a circuit diagram of a voltage divider and an internal supply voltage generation circuit including the same according to another exemplary embodiment of the present invention.

A voltage divider and an internal supply voltage generation circuit including the same according to another exemplary embodiment of the present invention will now be described with reference to FIG. 7. FIG. 7 is a circuit diagram of a voltage divider 11 and an internal supply voltage generation circuit 41 including the same according to another exemplary embodiment of the present invention. Elements having the same functions as those illustrated in FIG. 5 are indicated by like reference numerals, and thus their detailed description will be omitted.

Referring to FIG. 7, the voltage divider 11 includes first and second NMOS transistors M3 and M4. That is, the voltage divider 11 includes the first transistor M3 and the second transistor M4 connected in series, and the first transistor M3 and the second transistor M4 are NMOS transistors. According to a first bias voltage BIAS1 and a second bias voltage BIAS2, the first transistor M3 may operate in the first temperature-dependent region REGION1, and the second transistor M4 may operate in the second temperature-dependent region REGION2. Alternatively, according to the first bias voltage BIAS1 and the second bias voltage BIAS2, the first transistor M3 may operate in the second temperature-dependent region REGION2, and the second transistor M4 may operate in the first temperature-dependent region REGION1. In this embodiment, at least one of the first transistor M3 and the second transistor M4 is not diode-connected. In addition, another device, such as a resistor or a diode, may further be connected between the first transistor M3 and the second transistor M4.

While embodiments of the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An internal supply voltage generation circuit comprising:
    an output unit that receives an internal reference voltage and a feedback voltage and outputting an internal supply voltage; and
    a voltage divider comprising a first transistor and a second transistor connected in series, dividing the internal supply voltage, generating the feedback voltage, and providing the feedback voltage back to the output unit,
    wherein the first transistor has a resistance value that varies in proportion to a change in temperature, and the second transistor having a resistance value that varies in inverse proportion to the change in temperature.

2. The circuit of claim 1, wherein a first bias voltage is applied to the first transistor so that the first transistor can operate in a first temperature-dependent region, and a second bias voltage is applied to the second transistor so that the second transistor can operate in a second temperature-dependent region, wherein the first temperature-dependent region is a region in which drain-source current is reduced as temperature increases, and the second temperature-dependent region is a region in which the drain-source current is increased as the temperature increases.

3. The circuit of claim 2, wherein the first bias voltage is applied from an external source to a gate of the first transistor, and the second bias voltage is applied from the external source to a gate of the second transistor.

4. The circuit of claim 1, wherein the first transistor and the second transistor are PMOS transistors.

5. The circuit of claim 1, wherein the first transistor and the second transistor are NMOS transistors.

6. The circuit of claim 1, wherein at least one of the first transistor and the second transistor is not diode-connected.

7. The circuit of claim 1, wherein, when the internal supply voltage is applied to an output node and the feedback voltage is applied to a feedback node, the first transistor is connected between the output node and the feedback node, and the second transistor is connected between the feedback node and a ground node.

8. The circuit of claim 1, wherein, when the internal supply voltage is applied to an output node and the feedback voltage is applied to a feedback node, the second transistor is connected between the output node and the feedback node, and the first transistor is connected between the feedback node and the ground node.

9. The circuit of claim 1, wherein the output unit comprises:
    a comparator that compares the internal reference voltage to the feedback voltage and outputting a comparison voltage according to the comparison result; and
    a driver that outputs the internal supply voltage in response to a level of the comparison voltage.

10. The circuit of claim 1, wherein the internal supply voltage is provided to a circuit as a reference voltage of the circuit.

* * * * *